United States Patent
Nagle et al.

(10) Patent No.: US 9,330,751 B2
(45) Date of Patent: May 3, 2016

(54) SRAM WORDLINE DRIVER SUPPLY BLOCK WITH MULTIPLE MODES

(71) Applicants: Shahnaz Nagle, Austin, TX (US); Prashant Kenkare, Austin, TX (US)

(72) Inventors: Shahnaz Nagle, Austin, TX (US); Prashant Kenkare, Austin, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/579,840

(22) Filed: Dec. 22, 2014

(65) Prior Publication Data

US 2015/0194208 A1     Jul. 9, 2015

Related U.S. Application Data

(60) Provisional application No. 61/924,397, filed on Jan. 7, 2014.

(51) Int. Cl.
| G11C 11/40 | (2006.01) |
| G11C 11/419 | (2006.01) |
| G11C 8/08 | (2006.01) |

(52) U.S. Cl.
CPC ............. *G11C 11/419* (2013.01); *G11C 8/08* (2013.01)

(58) Field of Classification Search
CPC ...... G11C 5/147; G11C 8/08; G11C 11/4072; G11C 11/4074; G11C 11/419
USPC ............................. 365/154, 189.11, 226, 227
See application file for complete search history.

(56) References Cited

U.S. PATENT DOCUMENTS

| 6,141,240 A * | 10/2000 | Madan ................. G11C 11/417 365/154 |
| 7,529,117 B2 * | 5/2009 | Liaw ...................... G11C 5/147 365/154 |
| 2008/0055967 A1* | 3/2008 | Houston .............. G11C 11/413 365/154 |
| 2010/0309736 A1* | 12/2010 | Russell ................ G11C 11/413 365/189.011 |
| 2014/0119101 A1* | 5/2014 | Wang ...................... G11C 8/08 365/154 |

* cited by examiner

*Primary Examiner* — Tan T. Nguyen
(74) *Attorney, Agent, or Firm* — Sughrue Mion, PLLC (57) ABSTRACT

A wordline driver supply block supporting multiple operation modes of a memory of a microprocessor in a device for reducing power consumption thereof.

20 Claims, 11 Drawing Sheets

| PWR-GATE (410) | READ-ASSIST (420) | WRITE-ASSIST (430) | VDD_WL VALUE (440) |
|---|---|---|---|
| YES | X | X | FLOATING |
| NO | NO | NO | ALWAYS VDD_HIGH |
| NO | NO | YES | READ: VDD_HIGH<br>WRITE: VDD_HIGH + BOOST |
| NO | YES | NO | ALWAYS VDD |
| NO | YES | YES | READ: VDD<br>WRITE: VDD + BOOST |

SRAM WORDLINE DRIVER SUPPLY BLOCK WITH MULTIPLE MODES

CROSS-REFERENCE TO RELATED PATENT APPLICATION

This application claims the benefit of U.S. Provisional Application No. 61/924,397, filed on Jan. 7, 2014, in the United States Patent and Trademark Office, the disclosure of which is incorporated herein by reference in its entirety.

BACKGROUND

Methods and apparatuses consistent with embodiments relate to an improved wordline driver supply block, and more particularly to an improved wordline driver supply block having multiple modes.

With the proliferation of mobile devices and mobile applications executed on the mobile devices, a corresponding trend towards lower power consumption of the mobile devices is also being developed.

One mechanism by which lower power consumption of a mobile device may be attained is through reduced power consumption of a microprocessor of the mobile device. In particular, by lowering the operating voltage of the microprocessor of the mobile device, power consumption of the microprocessor, and thus the mobile device, may be reduced.

Typically, the lowest operating voltage (Vmin) for a microprocessor of a mobile device is set by memory, such as a Static Random Access Memory (SRAM). According to a conventional technique, to reduce power consumption, a dual supply may be employed in which a lower voltage level may be supplied to a portion of the memory, while a higher voltage level may be supplied to another portion of the memory. Thereby, as compared with a technique in which one high voltage level is supplied throughout the memory, because higher voltage is supplied to only a portion of the memory, power consumption may be reduced.

SUMMARY

According to an aspect of an embodiment, there is provided a wordline driver supply block that includes a wordline driver supply control circuit configured to receive one or more control inputs that indicate an operational mode of a memory of a microprocessor and output one or more control signals that indicate a wordline supply voltage corresponding to the operational mode; and a wordline driver supply circuit configured to receive the one or more control signals and one or more voltages, and output the wordline supply voltage corresponding to the operational mode based on the received one or more control signals and the one or more voltages.

According to an aspect of an embodiment, there is provided a method of controlling a memory of a microprocessor, the method including receiving one or more control inputs that indicate an operational mode of the memory; generating one or more control signals based on the one or more control inputs; combining the one or more control inputs into a multiplexer selection signal that indicates a wordline supply voltage corresponding to the operational mode; receiving one or more voltages; and outputting the wordline supply voltage corresponding to the operational mode based on the multiplexer selection signal and the one or more voltages.

BRIEF DESCRIPTION OF THE DRAWINGS

The above and/or other aspects will become more apparent by describing in detail embodiments with reference to the attached drawings in which.

DETAILED DESCRIPTION OF EMBODIMENTS

Embodiments will now be described more fully with reference to the accompanying drawings, in which like reference numerals refer to like elements throughout.

Expressions such as "at least one of," when preceding a list of elements, modify the entire list of elements and do not modify the individual elements of the list.

The matters defined in the description, such as detailed construction and elements, are provided to assist in a comprehensive understanding of the embodiments. However, it is understood that the embodiments may be practiced without those specifically defined matters. Also, well-known functions or constructions are not described in detail because they would obscure the description with unnecessary detail.

Various embodiments will be described more fully hereinafter with reference to the accompanying drawings, in which various aspects of embodiments are shown. The embodiments may, however, be embodied in many different forms and should not be construed as limited to embodiments set forth herein. Rather, these embodiments are provided so that this disclosure will be thorough and complete, and will fully convey the scope of various aspects of embodiments to those skilled in the art. In the drawings, the sizes and relative sizes of layers and regions may be exaggerated for clarity.

It will be understood that when an element or layer is referred to as being "on," "connected to" or "coupled to" another element or layer, the element can be directly on, connected or coupled to the other element or layer or intervening elements or layers may be present.

In the following description, terms such as "unit," "module," and "block" indicate a unit for processing at least one function or operation, wherein the unit, module, and block may be embodied as hardware circuitry or software or may be embodied by combining hardware circuitry and software.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of embodiments.

The terminology used herein is for the purpose of describing various aspects of particular embodiments only and is not intended to be limiting of embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the embodiments relate. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
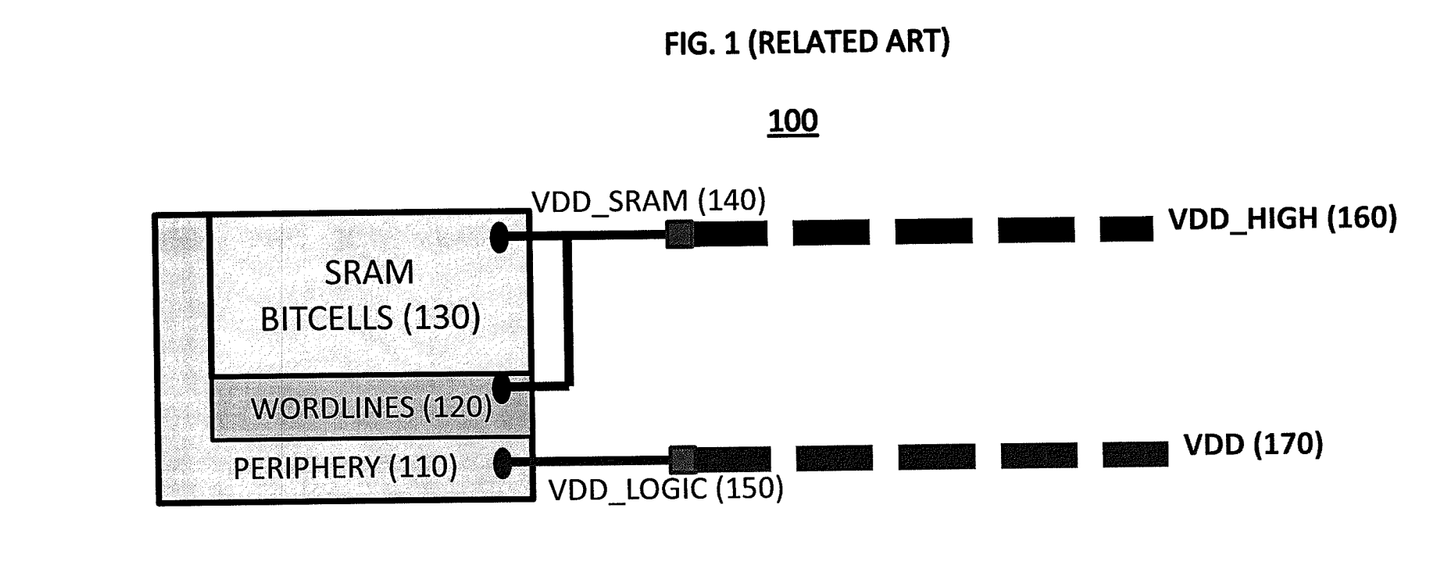
FIG. 1 illustrates a diagram of a conventional dual supply Static Random Access Memory (SRAM).

FIG. 1 illustrates a diagram of a conventional dual supply SRAM.

As illustrated in FIG. 1, the SRAM (100) includes periphery logic (110), wordlines (120), and bitcells (130).

According to a conventional dual supply approach, a voltage (VDD_SRAM) (140) applied to the wordlines (120) and bitcells (130) is raised to a voltage (VDD_HIGH) level (160) that is higher than a voltage level (VDD) (170) of the voltage (VDD_LOGIC) (150) that is applied to the periphery logic (110).

While the conventional dual supply approach offers lower SRAM operating voltage relative to the single supply approach, the minimum SRAM operating voltage will generally still be higher than non-SRAM circuits contained in the microprocessor. Given that minimum SRAM operating voltage typically determines the microprocessor lowest operating voltage, it will be advantageous to lower the SRAM operating voltage below that allowed by the conventional dual supply approach.

Figure 2:
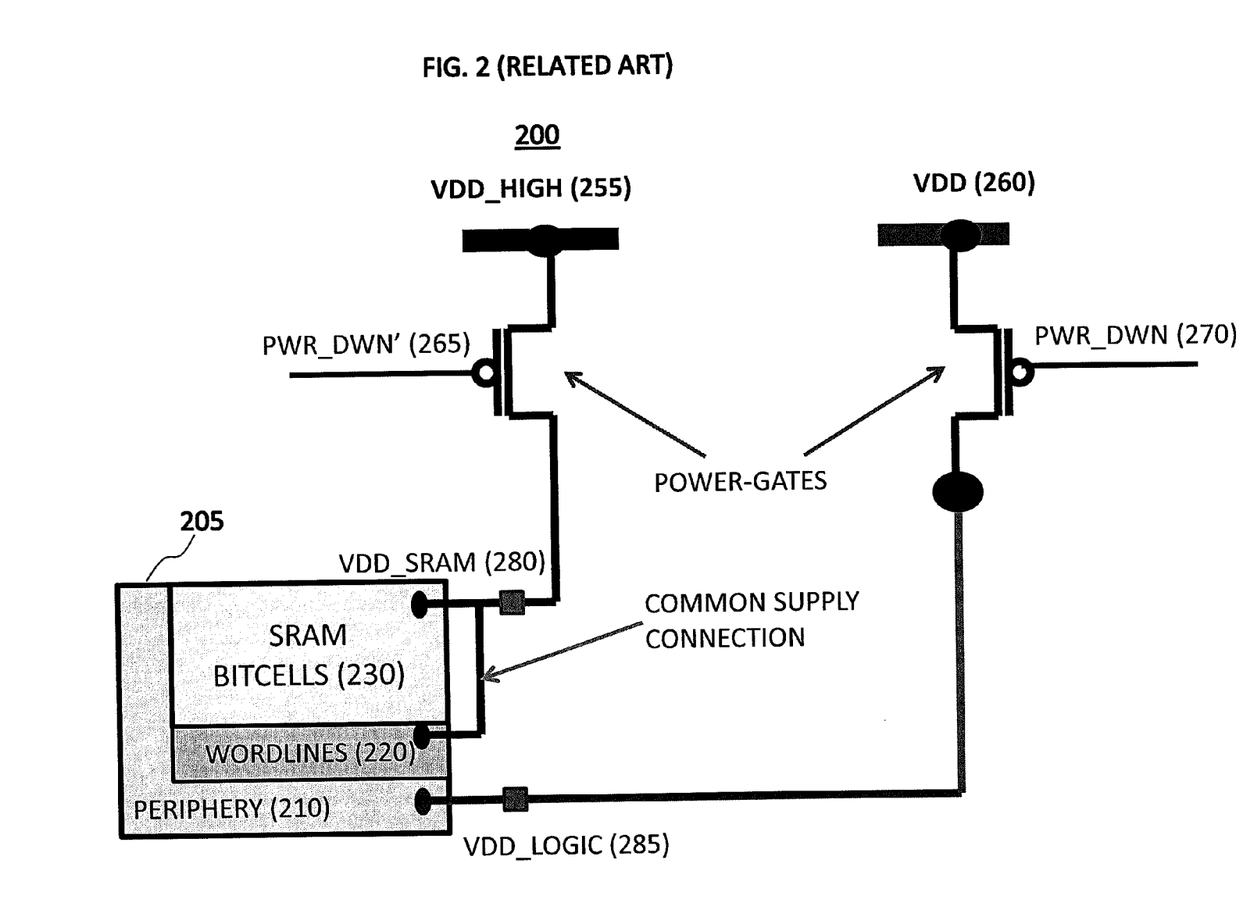
FIG. 2 illustrates a circuit diagram of wordline driver supply circuit for the conventional dual supply SRAM illustrated in FIG. 1.

FIG. 2 illustrates a circuit diagram of wordline driver supply circuit in combination with the conventional dual supply SRAM illustrated in FIG. 1.

As illustrated in FIG. 2, the wordline driver supply circuit (200) may be connected to SRAM (205). The SRAM (205) includes periphery logic (210), wordlines (220), and bitcells (230). The SRAM (205) is similar to the SRAM (100) discussed above with respect to FIG. 1, and therefore a detailed description of the SRAM (205) is omitted.

The wordline driver supply circuit (200) includes power gates (PWR_DWN' 265 and PWR_DWN 270) connected to power supplies (VDD_HIGH 255 and VDD 260). As illustrated, the power gates are PMOS transistors. For example, power gate "PWR_DWN' 265" refers to a PMOS transistor whose gate-terminal is connected to a control signal PWR_DWN' 265. Similarly, power gate "PWR_DWN 270" refers to a PMOS transistor whose gate-terminal is connected to a control-signal PWR_DWN 270. The PWR_DWN' 265 control signal is a level-shifted version of the PWR_DWN 270 control signal. This level-shifting is applied because PWR_DWN' 265 controls the gate-terminal of a PMOS transistor connected to a higher supply voltage VDD_HIGH 255. Hence, PWR_DWN' 265 will preferably be level-shifted to the VDD_HIGH 255 power-supply domain, while the PWR_DWN 270 control signal is in the VDD 260 power-supply domain.

The power gate (PWR_DWN' 265) is connected to both the SRAM bitcells (230) and wordlines (220) for supplying power (VDD_SRAM 280) thereto, while the power gate (PWR_DWN 270) is connected to the periphery logic (210) of the SRAM (205) for supplying power (VDD_LOGIC 285) thereto.

Figure 3:
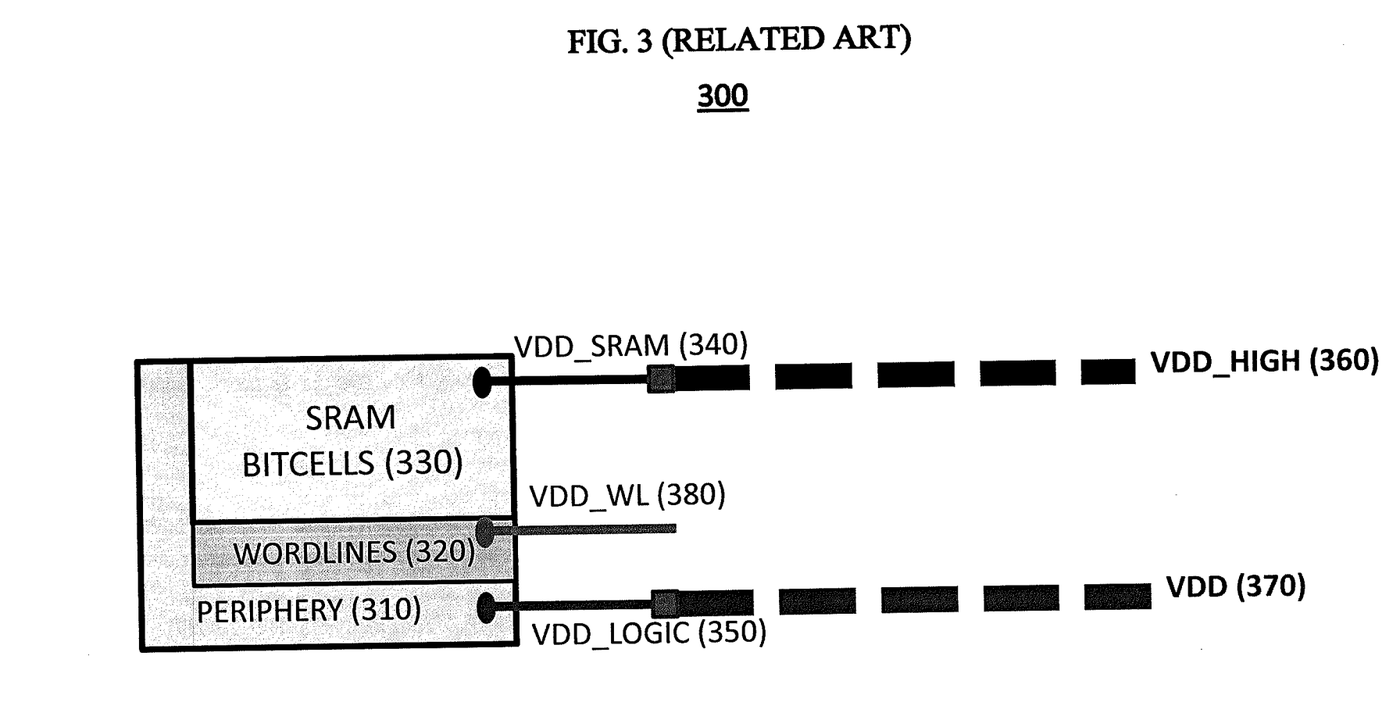
FIG. 3 illustrates a diagram of a conventional dual supply SRAM.

FIG. 3 illustrates a diagram of a conventional dual supply SRAM.

As illustrated in FIG. 3, the SRAM (300) includes periphery logic (310), wordlines (320), and bitcells (330).

According to the dual supply approach illustrated in FIG. 3, a voltage (VDD_SRAM) (340) applied to the bitcells (330) is raised to a voltage (VDD_HIGH) level (360) that is higher than a voltage level (VDD) (370) of the voltage (VDD_LOGIC) (350) that is applied to the periphery logic (310). However, due to the lower voltage (Vmin), a voltage (VDD_WL) (380) is applied to the wordlines (320) to separately manipulate the wordline voltage level, as opposed to the common manipulation of the voltage (VDD_SRAM) (140) level applied to the wordlines (120) and bitcells (130) in FIG. 1. Furthermore, it would be desirable to turn-off (i.e., float) the VDD_WL (380) voltage during a power-saving mode. For example, such a power-saving mode might occur when the processor of a device is inactive.

Here, the wordline voltage (VDD_WL) level (380) may vary according to, for example, a power down operation of the SRAM of the microprocessor. Alternatively, the wordline voltage (VDD_WL) (380) may be adjusted based on whether a read operation or a write operation is being performed. Additionally, the wordline voltage (VDD_WL) (380) may be adjusted based on post-silicon memory test results that indicate fabrication properties of the SRAM (300). Thereby, the wordline voltage (VDD_WL) (380) may be controlled as necessary based on a particular operation or operational mode of the SRAM (300).

Embodiments of the present application may overcome the above disadvantages. However, an embodiment is not required to overcome the above disadvantages.

As noted above, the conventional dual supply approach is superior to the single supply approach, in terms of allowing lower operating SRAM voltage. However, this lower operating SRAM voltage will still exceed the minimum operating voltage of non-SRAM circuits on the microprocessor. The continued lowering of SRAM minimum voltage, accordingly, requires inclusion of a read-assist mode and/or a write-assist mode. While these read-assist and write-assist modes generally allow lower SRAM operating voltage relative to the conventional dual supply approach, there are disadvantages associated with slower processing speed and increased power consumption. Hence, it is desirable to use read-assist and/or write-assist modes only when necessary. However, in the read-assist mode and the write-assist mode, power consumption may also be increased. Accordingly, the read-assist mode and the write-assist mode may be selectively activated.

The artisan of ordinary skill will understand that the read-assist and the write-assist modes may be variously implemented. According to embodiments, the read-assist and the write-assist modes are row-based, as opposed to column-based.

During read-assist, wordlines are lowered to match the periphery voltage (below the bitcell supply voltage), thereby improving a read-disturb margin. During write-assist, the wordline voltage is capacitively boosted above the power supply (above the bitcell supply voltage).

For example, during write assist, the wordline corresponding to input address may be asserted. Then, it may be ensured that the bitlines have dropped, for example to ~200 mV above ground. The wordline may be disconnected from the power supply, for example through activation of an assist clock. The wordline power is capacitively bootstrapped to a voltage value higher than the supply, and the boost may be turned off to bring the wordline voltage back to supply voltage using an optional chop signal.

To avoid wordlines being at elevated (boost level) once the write is completed, another signal (chop) may be added. This chop signal will release the wordlines from being at elevated voltages to the array power level and may be adjusted according to the programmable delay circuit.

Implementations of the improved wordline driver supply block integrating the read-assist and the write-assist modes will be discussed below.

The continued lowering of SRAM minimum voltage also requires inclusion of a power-down or power-gating mode. In the power-gating mode, the SRAM may be completely disconnected such that the SRAM does not consume additional power.

The actual usage of the read-assist, write-assist, and power-gating modes may depend on post-silicon results. Accordingly, the wordline driver supply may be in one of five possible states.

Merely combining these analog modes may be costly in terms of performance and area. Accordingly, aspects of the embodiments relate to an improved wordline driver supply block which seamlessly integrates read-assist and write-assist capability in combination with power-gating having negligible overhead in terms of area and speed.

Hereinafter, various aspects of embodiments will be more fully described, with reference to the accompanying drawings.

Figure 4:
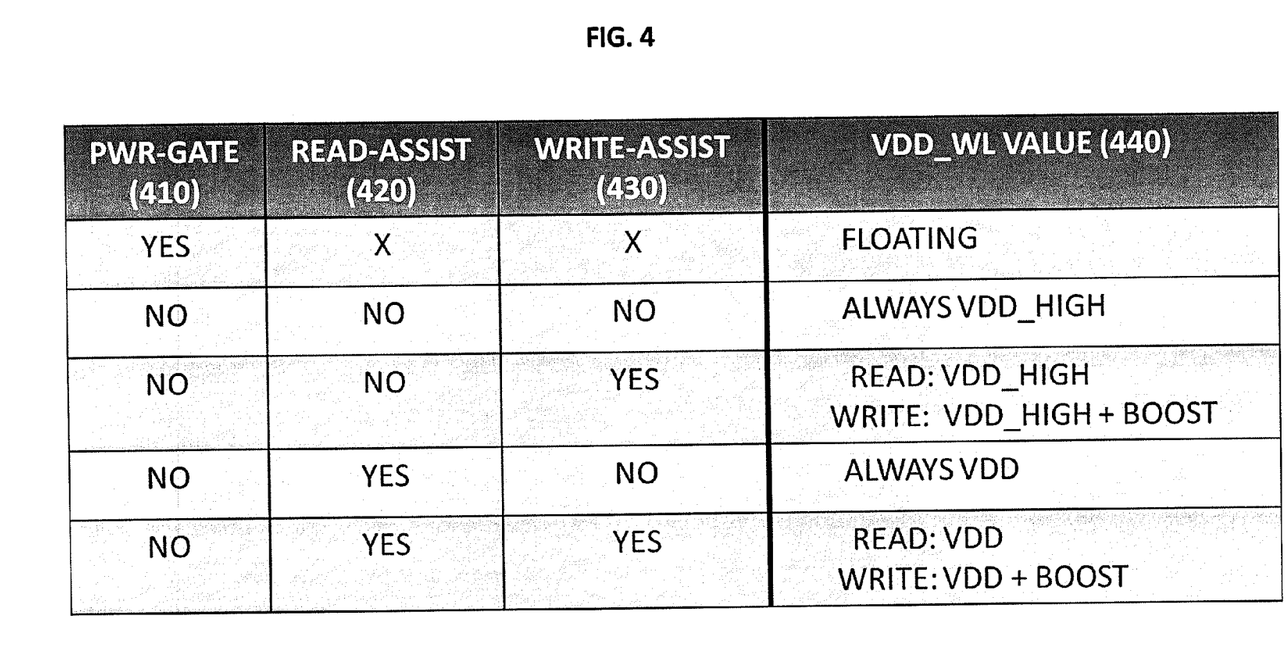
FIG. 4 illustrates a table of wordline supply modes, according to an embodiment.

FIG. 4 illustrates a table of wordline supply modes, according to an embodiment.

A value of the wordline supply voltage (VDD_WL) may depend on multiple factors or operational modes. According to the embodiment illustrated in FIG. 4, the modes may include a power-gate (PWR-GATE) mode, a read-assist mode, and a write-assist mode. According to the selected mode, a value of the wordline supply voltage (VDD_WL) (440) may be set when performing an operation, as discussed below.

As illustrated in FIG. 4, the wordline supply voltage (VDD_WL) (440) may depend on whether a Static Random Access Memory (SRAM) of a microprocessor is set to a power-gating mode. The SRAM may be set to the power-gating mode by interpreting a power-gate (PWR-GATE) signal (410). In the power-gating mode, the SRAM may be completely disconnected such that the SRAM does not consume additional power. For example, in the power-gating mode, the value of the wordline supply voltage (VDD_WL) (440) may be a floating value to conserve power.

Alternatively, as also illustrated in FIG. 4, the wordline supply voltage (VDD_WL) (440) may depend on whether the SRAM is operating in a read-assist mode, a write-assist mode, neither the read-assist mode nor the write-assist mode, or both the read-assist mode and the write-assist mode. The SRAM may be set to the read-assist mode, the write-assist mode, or a combination thereof by interpreting a read-assist signal (READ-ASSIST) signal (420) and a write-assist signal (WRITE-ASSIST) (430).

In the read-assist mode and the write-assist mode, both processing delay and power consumption may be increased. Accordingly, the read-assist mode and the write-assist mode may be selectively activated.

For example, when the SRAM is operating in neither the read-assist mode nor the write-assist mode, the value of the wordline supply voltage (VDD_WL) (440) may be a high value (VDD_HIGH). Accordingly, the value of the wordline supply voltage (VDD_WL) (440) may be the high value (VDD_HIGH) when performing read and write operations.

When the SRAM is operating in the write-assist mode, the value of the wordline supply voltage (VDD_WL) (440) may be a higher value (VDD_HIGH+BOOST) that is greater than the high value (VDD_HIGH). Here, the higher value (VDD_HIGH+BOOST) that is greater than the bitcell supply voltage. Accordingly, the value of the wordline supply voltage (VDD_WL) (440) may be the higher value (VDD_HIGH+BOOST) when performing a write operation and the value of the wordline supply voltage (VDD_WL) (440) may be the high value (VDD_HIGH) when performing a read operation.

When the SRAM is operating in the read-assist mode, the value of the wordline supply voltage (VDD_WL) (440) may be a low value (VDD) that is lower than the high value (VDD_HIGH). Accordingly, the value of the wordline supply voltage (VDD_WL) (440) may be the low value (VDD) when performing read and write operations.

Last, when the SRAM is operating in the write-assist mode and the read-assist mode, the value of the wordline supply voltage (VDD_WL) (440) may be a value (VDD+BOOST) when performing a write operation. On the other hand, the value of the wordline supply voltage (VDD_WL) (440) may be low value (VDD) when performing a read operation.

Although the values of the wordline supply voltage (VDD_WL) (440) are illustrated for each operational mode as shown in FIG. 4, it will be understood by the artisan of ordinary skill that the wordline supply voltage (VDD_WL) values may be variously associated with each mode based on implementation. Accordingly, the wordline supply voltage (VDD_WL) values may be higher or lower, according to a desired implementation.

Although not illustrated in FIG. 4, the artisan of ordinary skill will understand that bitcell of the SRAM may receive a high voltage, such as voltage at the high value (VDD_HIGH), and the periphery logic of the SRAM may receive a low voltage, such as voltage at the low value (VDD). Accordingly, the values of the wordline supply voltage (VDD_WL) may fluctuate as needed, for example between the low value (VDD) and the high value (VDD_HIGH), and higher than the high value, for example to the higher value (VDD_HIGH+BOOST). Such fluctuation may be controlled by, for example, a multiplexing technique as will be discussed below.

Figure 5:
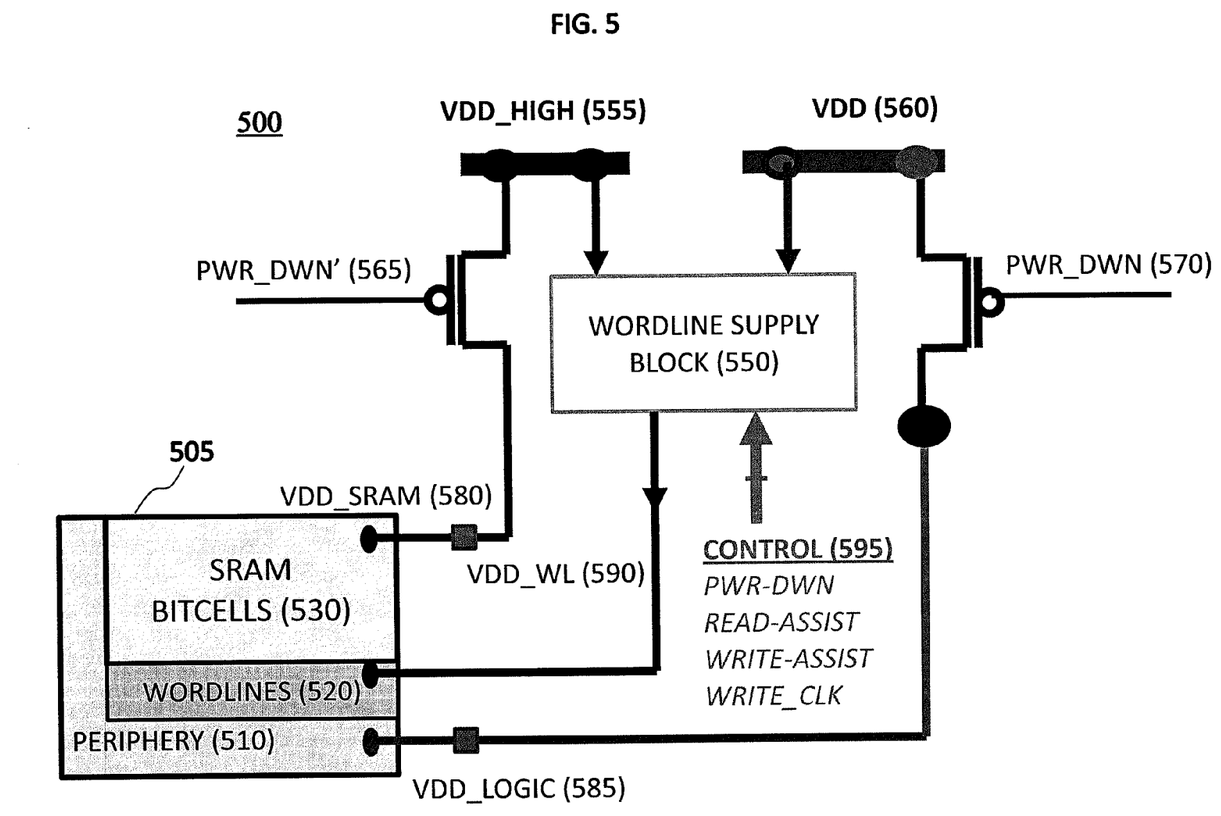
FIG. 5 is a block diagram of a system including a wordline driver supply block, according to an embodiment.

FIG. 5 is a block diagram of a system including a wordline driver supply block, according to an embodiment.

As illustrated in FIG. 5, the system (500) may include a wordline supply block (550), an SRAM (505), and power supplies. The system (500) may be configured as a microprocessor of a device, for example a mobile device.

The wordline driver supply block (550) may be connected to SRAM (505). The SRAM (505) includes periphery logic (510), wordlines (520), and bitcells (530). The SRAM (505) is similar to the SRAM (100) discussed above with respect to FIG. 1, and therefore a detailed description of the SRAM (505) is omitted.

The wordline driver supply block (550) may also be connected to power supplies (VDD_HIGH 555 and VDD 560)

for supplying power to the wordlines (520) of the SRAM (505). The power supplies (VDD 560 and VDD_HIGH 555) may be respectively connected to the SRAM (505) through power gate (PWR_DWN' 565) for supplying power (VDD_SRAM 580) to the bitcells (530) and through power gate (PWR_DWN 570) for supplying power (VDD_LOGIC 585) to the periphery logic (510) of the SRAM (505). Details of the power supplies (555, 560), power gates (565, 570), and SRAM (505) have been discussed above with respect to FIG. 1 through FIG. 3, and therefore further detailed description thereof is omitted.

The wordline driver supply block (550) may be controlled according to a control signal (595), which may indicate the wordline driver supply block (550) to assert a wordline supply voltage (VDD_WL 590) according to the control signal (595).

The control signal (595) may indicate whether to enable the power-gating mode (PWR-DWN), read-assist mode (READ-ASSIST), or write-assist (WRITE-ASSIST) mode. The read-assist mode, write-assist mode, and the power-gating mode have been discussed above with respect to FIG. 4, and therefore further detailed description thereof is omitted.

The control signal (595) may also include a write clock (WRITE_CLK) signal, which will be discussed below.

Figure 6:
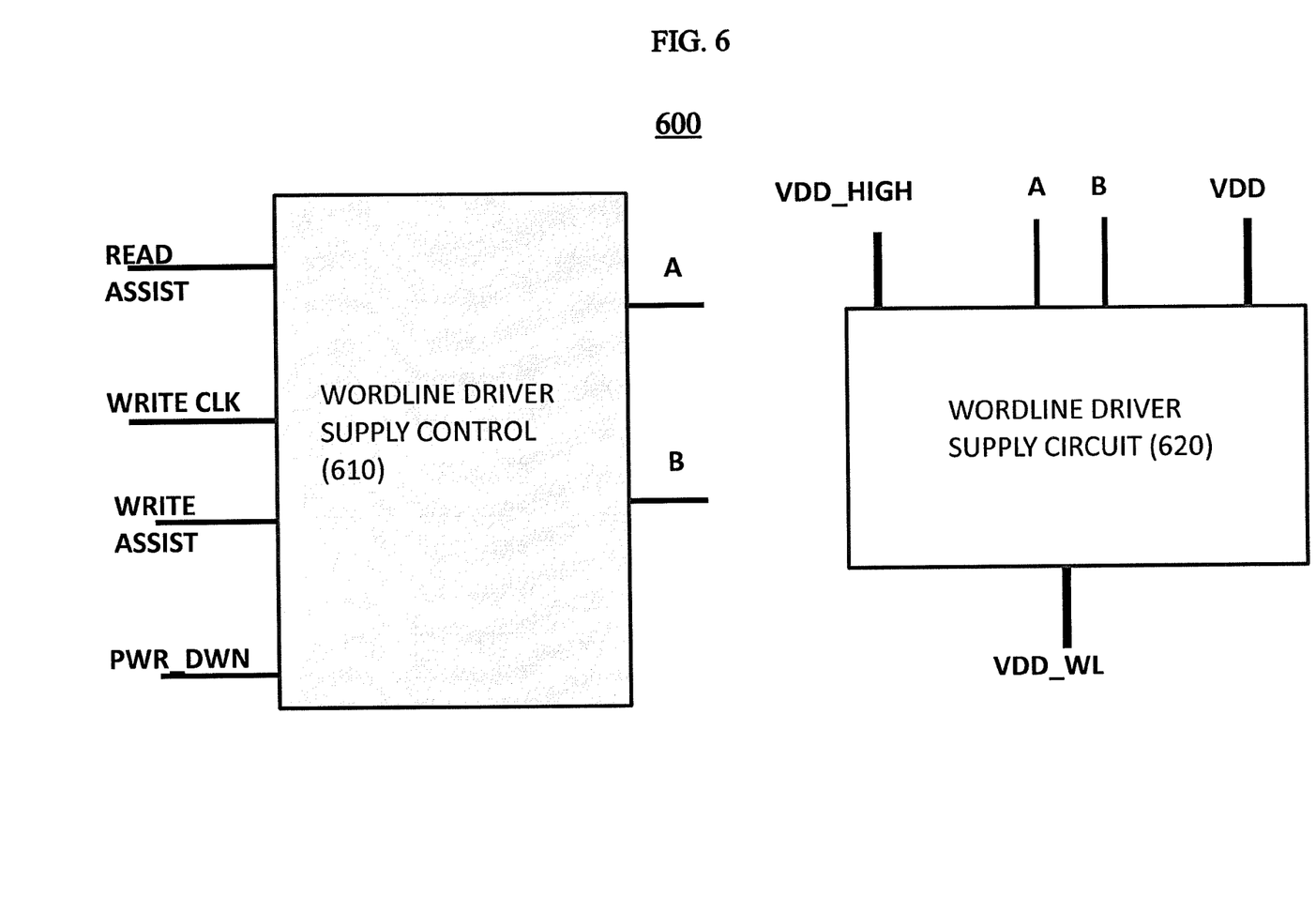
FIG. 6 is a block diagram of a wordline driver supply block, according to an embodiment.

FIG. 6 is a block diagram of a wordline driver supply block, according to an embodiment.

As illustrated in FIG. 6, the wordline driver supply block (600) includes a wordline driver supply control (610) and a wordline driver supply circuit (620).

The wordline driver supply control (610) receives control signals. The control signal may indicate whether to enable the power-gating mode (PWR-DWN), read-assist mode (READ-ASSIST), or write-assist (WRITE-ASSIST) mode. Alternatively, the control signal may also include a write clock (WRITE_CLK) signal.

Based on the received control signals, the wordline driver supply control (610) outputs signals (A, B) to the wordline driver supply circuit (620). The output signals (A, B) indicate whether to output wordline voltages for the power-gating mode, read-assist mode, or write-assist mode.

The wordline driver supply circuit (620) may be embodied to have an analog behavior. For example, the wordline driver supply circuit (620) may be more sophisticated than a conventional multiplexer, and may integrate: a voltage multiplexer, a boost circuit, a power gate, and bootstrap capacitor to avoid series transistors. The boosting of the wordline voltage (VDD_WL) has been discussed above with respect to FIG. 4.

The wordline driver supply circuit (620) may receive voltages (VDD and VDD_HIGH) as inputs, in addition to the signals (A, B) output by the wordline driver supply control (610).

Based on the signals (A, B) received from the wordline driver supply control circuit (610), the wordline driver supply circuit (620) may determine a voltage (VDD_WL) to output to the wordline of the SRAM.

Figure 7:
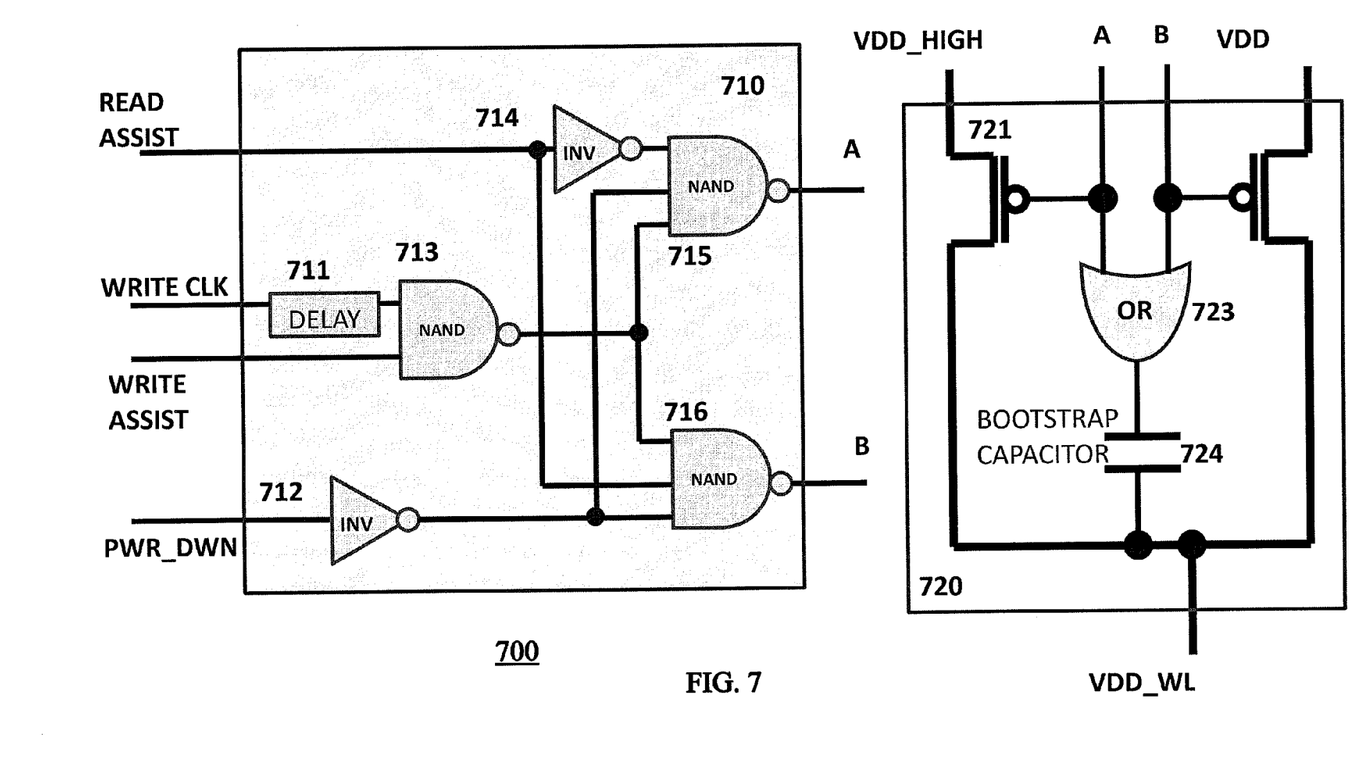
FIG. 7 is a circuit diagram of the wordline driver supply block illustrated in FIG. 6.

FIG. 7 is a circuit diagram of the wordline driver supply block illustrated in FIG. 6.

As illustrated in FIG. 7, the wordline driver supply block (700) includes a wordline driver supply control (710) and a wordline driver supply circuit (720). The wordline driver supply control (710) and the wordline driver supply circuit (720) have been discussed above with respect to the wordline driver supply control (610) and the wordline driver supply circuit (620) of FIG. 6.

In greater detail, the wordline driver supply control (710) includes a delay circuit (711) inverters (712, 714), and (NAND) gates (713, 715, and 716).

The delay circuit (711) receives input of the write clock (WRITE CLK) signal, and will be discussed in greater detail below.

The gate (713) receives as an input the output of the delay circuit (711) and the write-assist (WRITE ASSIST) signal.

The inverter (712) receives as an input the power down (PWR_DWN) signal and outputs an inverted signal.

The inverter (714) receives as an input the read-assist (READ ASSIST) signal and outputs an inverted signal.

The gate (715) receives as inputs the inverted signal output by the inverter (714), the output of the gate (713), and the inverted signal of the inverter (712), and outputs a control signal (A) to the wordline driver supply circuit (720). The control signal (A) has been discussed above with respect to FIG. 6.

The gate (716) receives as inputs READ ASSIST control input, the output of the gate (713), and the inverted signal of the inverter (712), and outputs a control signal (B) to the wordline driver supply circuit (720). The control signal (B) has also been discussed above with respect to FIG. 6.

The wordline driver supply circuit (720) includes transistors (721 and 722), (OR) gate (723), and bootstrap capacitor (724).

The wordline driver supply circuit (720) receives as inputs the power supplies (VDD and VDD_HIGH) and control signals (A, B) output by the wordline driver control supply control (710).

The transistors (721 and 722) may be, for example, a p-type metal-oxide-semiconductor (PMOS) transistor or p-channel field-effect transistor (PFET), but the transistors (721 and 722) are not limited thereto. As also illustrated in FIG. 7, the transistors (721 and 722) may be connected in parallel, while avoiding configurations in which transistors may be connected in series. Thereby, an impact on speed of the wordline driver supply circuit (720) may be minimized.

The transistor (721) may be connected to power supply (VDD_HIGH) and the control line of signal (A) for control thereof. Conversely, the transistor (722) may be connected to power supply (VDD) and the control line of signal (B) for control thereof.

The gate (723) receives the inputs on the lines of the control signals (A, B) and outputs a signal to bootstrap capacitor (724).

The bootstrap capacitor (724) generates an output for controlling the wordline supply voltage (VDD_WL). The bootstrap capacitor (724) may be used during the write-assist operation. Specifically, the bootstrap capacitor (724) may capacitively boost the wordline supply to an ensure improved write operation.

The bootstrap capacitors (724) may be created using one or more approaches, for example metal-to-metal capacitors and gate-dielectric capacitors would be appropriate, but the artisan of ordinary skill would understand that the bootstrap capacitor is not limited thereto.

More specifically, if the transistor (721) or the transistor (722) is on, as determined by the input control signals (A, B), then the wordline supply voltage (VDD_WL) will respectively correspond to the voltage (VDD_HIGH) if the transistor (721) is on and the voltage (VDD) if the transistor (722) is on.

Alternatively, the wordline supply voltage (VDD_WL) may be boosted above either the VDD or VDD_HIGH supply levels if control signals A and B possess the correct time-dependent behavior. It should be noted that wordline supply control circuit 710 will prevent control signals A and B from being simultaneously asserted (i.e., both A and B low logic-levels). As a result, transistors 721 and 722 cannot be both "ON" at the same time.

For example, assume control signal B is at a high logic-level such that transistor 722 is off. In this instance, the assertion of control signal A (low logic-level) results in transistor 721 being on (i.e., conducting state), such that VDD_WL is initially at the VDD_HIGH voltage level. The VDD_WL node will now be capacitively boosted above VDD_HIGH if control signal A transitions from a low logic-level to a high logic-level after a certain predetermined time-duration. Such a low-to-high transition of control signal A results in turning off (i.e., inducing a non-conducting state) transistor 721 and capacitively coupling the output of OR gate 723 to the VDD_WL node through bootstrap capacitor 724.

This particular time-dependent behavior of control signal A resulted in VDD_WL being capacitively boosted above the VDD_HIGH voltage level. Conversely, the VDD_WL node will be capacitively boosted above the VDD voltage level for the case in which control signal A is de-asserted (i.e., high voltage-level) and control signal B transitions from a low voltage level to a high voltage level after a predetermined time-duration. In the preferred embodiment, the wordline supply control circuit 710 will be powered by the VDD_HIGH supply domain such that high logic-level for control signals A and B will correspond to the VDD_HIGH supply value. While control signal B can operate correctly with a high logic-level corresponding to the VDD supply value, it is preferred to maintain the wordline driver supply circuit 710 in the VDD_HIGH domain to enable layout simplicity by allowing transistors in close proximity to be powered by the same power-supply level. Hence, in this preferred embodiment, both control signals A and B will operate in the VDD_HIGH domain.

Accordingly, the wordline supply voltage (VDD_WL) to the SRAM may be controlled.

Figure 8:
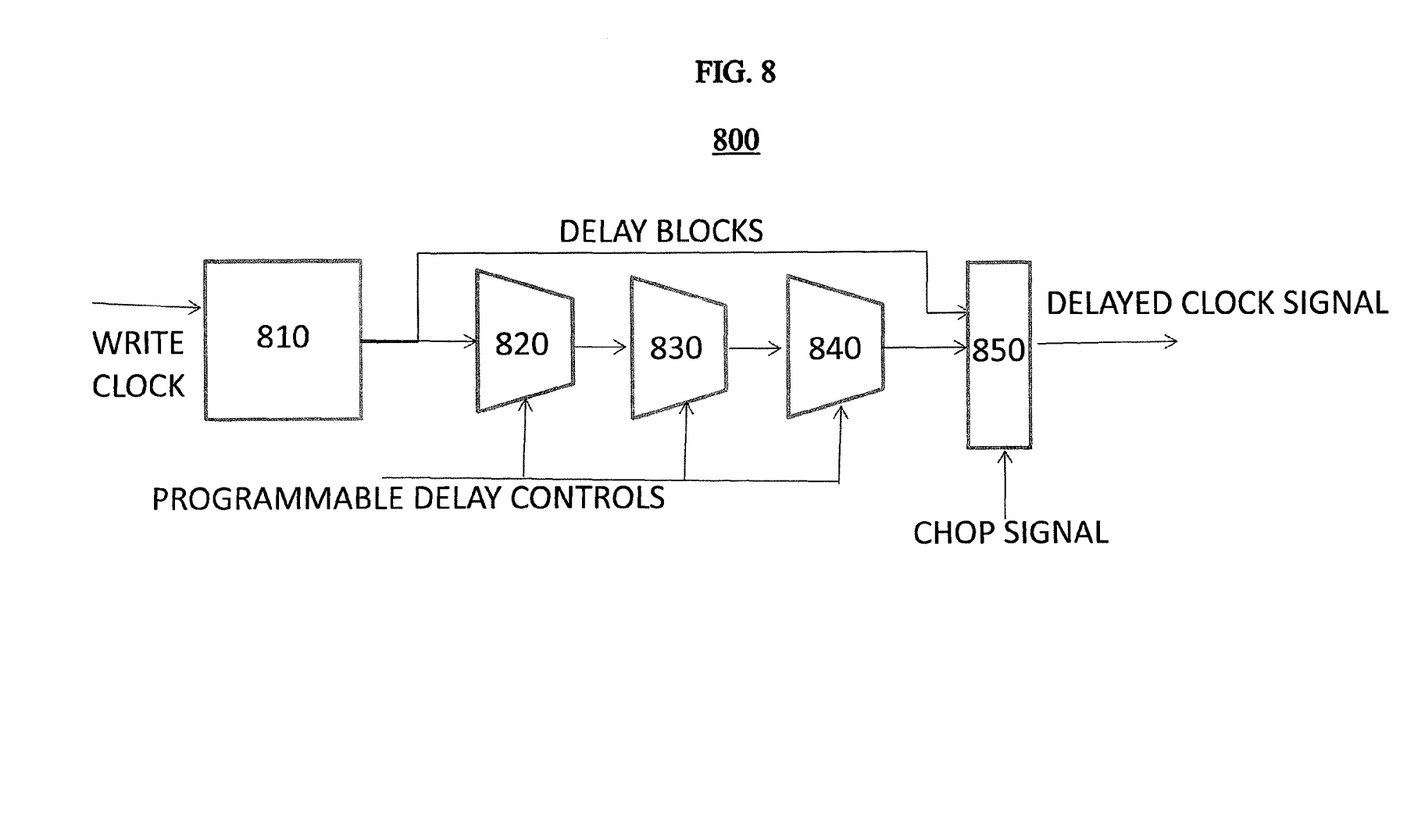
FIG. 8 is a circuit diagram of the delay circuit illustrated in FIG. 7.

FIG. 8 is a circuit diagram of the delay circuit illustrated in FIG. 7.

As illustrated in FIG. 8, the delay circuit (800) may include an input (810), delay blocks (820, 830, and 840), and output (850). The delay circuit (800) corresponds to the delay circuit (711) illustrated in FIG. 7.

The input (810) receives the write clock (WRITE CLOCK) signal and outputs the signal through delay blocks (820-840).

The delay blocks (820-840) propagate the signal through programmable delay, as controlled by programmable delay control inputs to the delay blocks (820-840).

The output (850) outputs the delayed clock signal received from the delay blocks (820-840) as controlled according to the chop signal.

More specifically, to avoid wordlines being elevated (boost level) once the write is completed, the signal (chop) is added. This chop signal will release the wordlines from being at elevated voltages to the array power level, and may be adjusted according to the programmable delay circuit.

The artisan of ordinary skill will understand that the delay circuit illustrated in FIG. 8 is merely exemplary, and the delay circuit may be variously configured through various combinations of delay circuitry.

Figure 9:
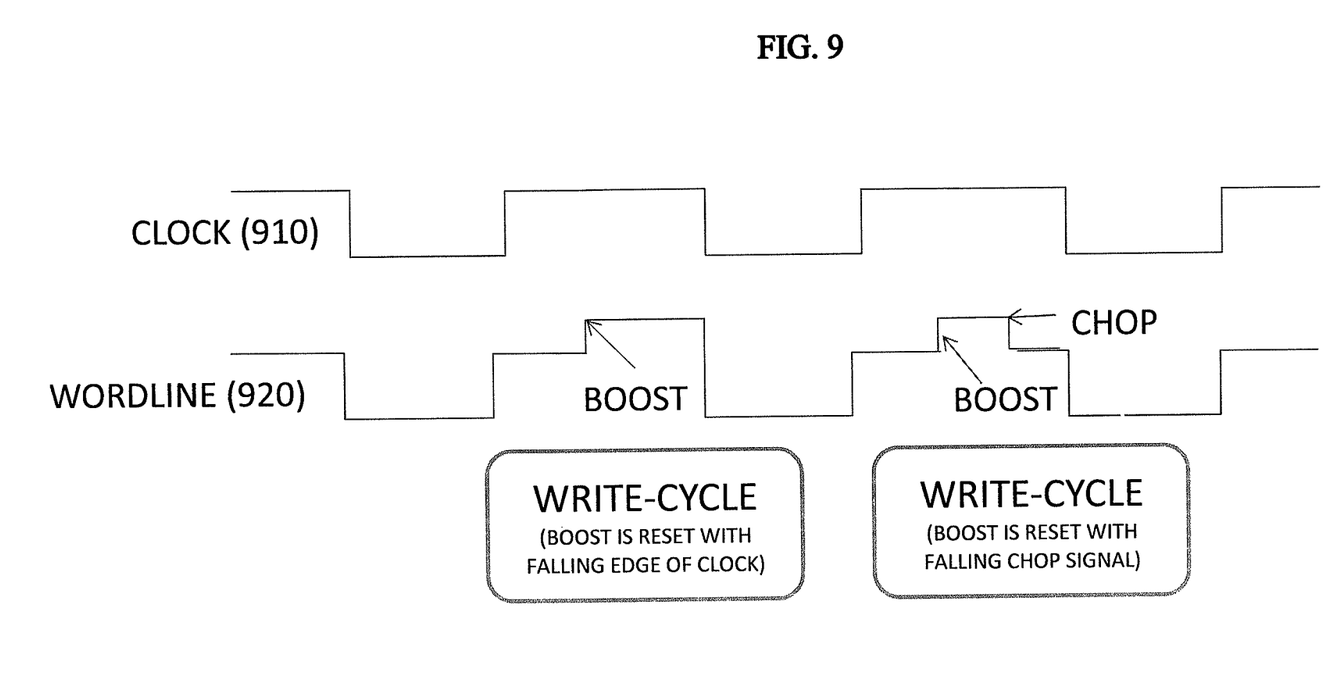
FIG. 9 illustrates a waveform for the wordline supply voltage with boost, according to an embodiment.

FIG. 9 illustrates a waveform for the wordline supply voltage with boost, according to an embodiment.

As illustrated in FIG. 9, a clock signal (CLOCK) (910) and the wordline (WORDLINE) (920) are illustrated.

According to a first embodiment, in the write-cycle, the boosted signal may be reset with the falling edge of the clock signal. However, according to a second embodiment, in the write-cycle, the boosted signal may be reset with the falling chop signal.

As a result, the wordlines may be released from elevated voltages according to the programmable delay circuit.

Figure 10:
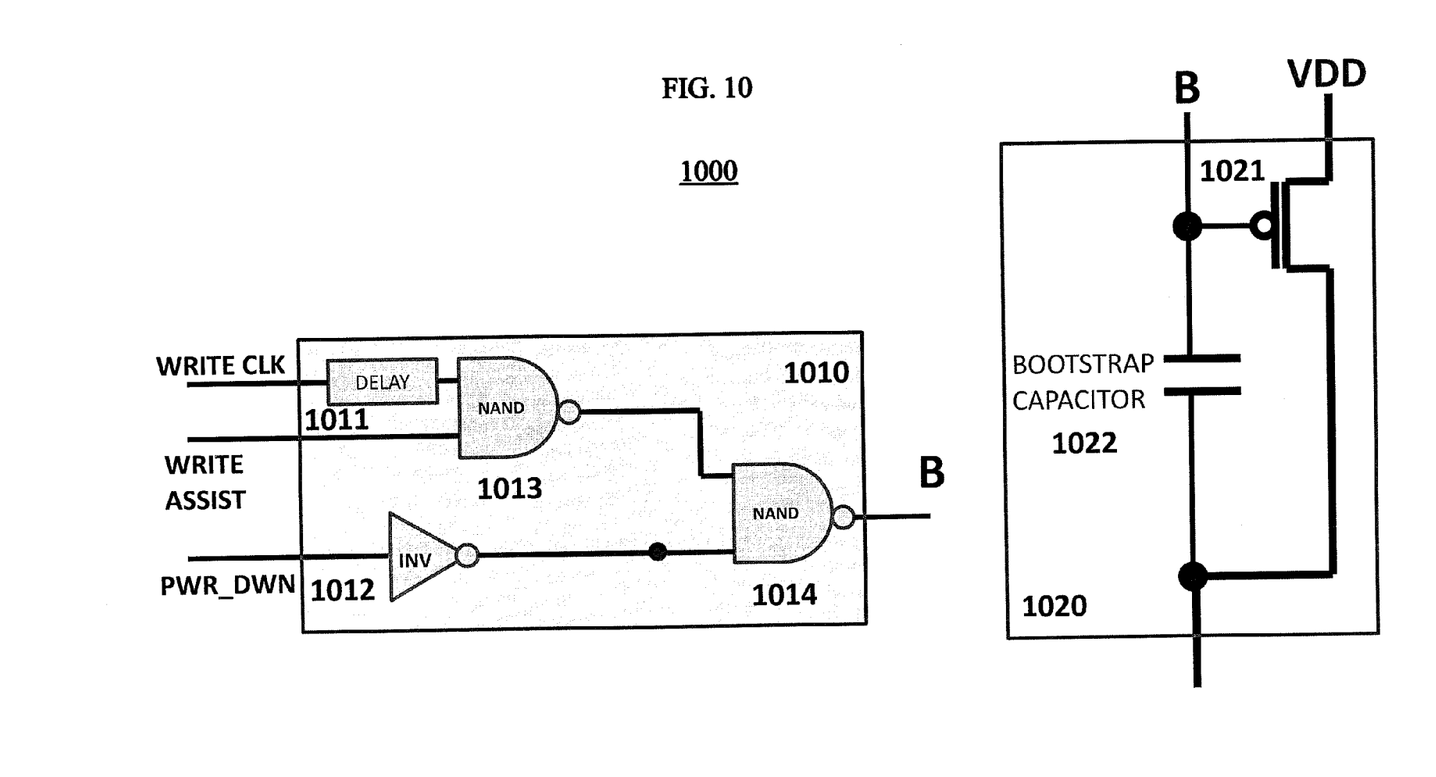
FIG. 10 is a circuit diagram of a wordline driver supply block, according to an embodiment.

FIG. 10 is a circuit diagram of a wordline driver supply block, according to an embodiment.

As illustrated in FIG. 10, the wordline driver supply block (1000) includes wordline driver supply control (1010) and wordline driver supply circuit (1020).

According to the embodiment illustrated in FIG. 10, the wordline driver supply block (1000) may be a single-supply memory having no read-assist mode. As a result, while the wordline driver supply block of FIG. 7 includes five modes, the wordline driver supply block (1000) of FIG. 10 includes only three modes. The term "modes" refers to the different voltage values node VDD_WL may assume. For example, in FIG. 7, the VDD_WL node may assume the following five voltage values: VDD, VDD_HIGH, VDD+boost, VDD_HIGH+boost, and floating in case of power-down. Similarly, in FIG. 10, the VDD_WL node may assume three voltage values: VDD, VDD+boost, floating in case of power-down. The "boost" refers to capacitive boosting, such that VDD_WL exceeds the nominal supply value of either VDD_HIGH or VDD.

In particular, as illustrated in FIG. 10, the wordline driver supply control (1010) receives only the write clock (WRITE CLK) signal, the write-assist (WRITE ASSIST) signal, and the power down (PWR_DWN) signal.

The wordline driver supply control (1010) includes delay circuit (1011), which may be similar to the delay circuit illustrated in FIG. 8, inverter (1012), and (NAND) gates (1013 and 1014).

The wordline driver supply control (1010) may output a control signal (B), based on the received inputs, similar to the operations discussed above with respect to FIG. 7, and therefore further detailed description thereof is omitted.

The wordline driver supply circuit (1020) includes transistor (1021) and bootstrap capacitor (1022), which may be similar to the bootstrap capacitor illustrated in FIG. 7.

Based on the control signal (B) and voltage (VDD), the wordline driver supply circuit (1020) may output the wordline supply voltage (VDD_WL) according to the three modes, as described above.

Figure 11:
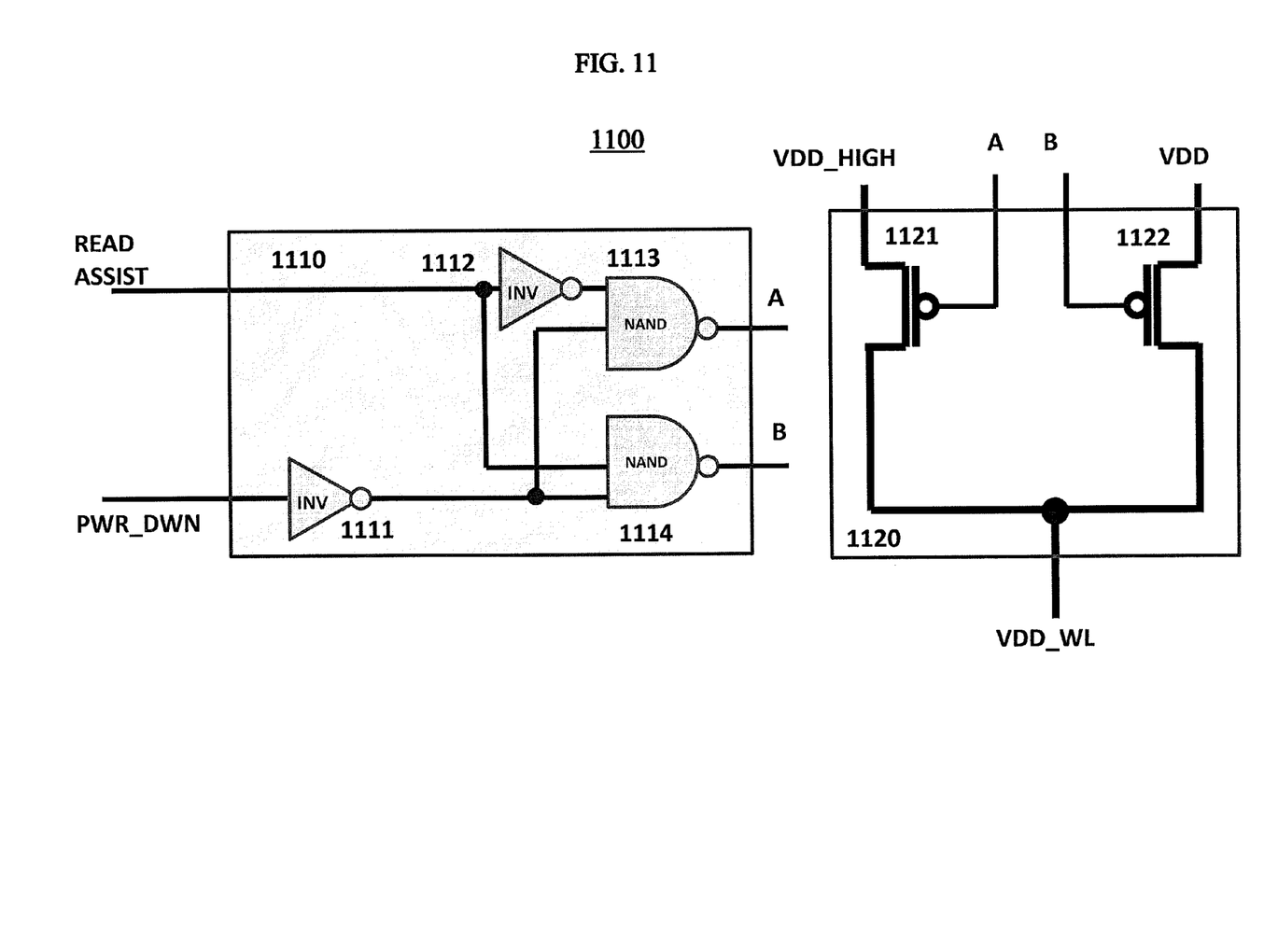
FIG. 11 is a circuit diagram of a wordline driver supply block, according to an embodiment.

FIG. 11 is a circuit diagram of a wordline driver supply block, according to an embodiment.

As illustrated in FIG. 11, the wordline driver supply block (1100) includes wordline driver supply control (1110) and wordline driver supply circuit (1120).

According to the embodiment illustrated in FIG. 10, the wordline driver supply block (1100) may be for a dual-supply memory having no write-assist mode. As a result, while the wordline driver supply block of FIG. 7 includes five modes, the wordline driver supply block (1100) of FIG. 11 includes only three modes. As described above, the term "modes" refers to the different voltage values which VDD_WL may assume. In FIG. 11, the VDD_WL node may assume the following three values: VDD, VDD_HIGH, and floating in case of power-down where control signals A and B will both be at a high logic-level.

In particular, as illustrated in FIG. 11, the wordline driver supply control (1110) receives only the read-assist (READ ASSIST) signal and the power down (PWR_DWN) signal.

The wordline driver supply control (1110) includes inverters (1111 and 1112) and (NAND) gates (1113 and 1114).

The wordline driver supply control (1110) may output control signals (A, B), based on the received inputs, similar to the operations discussed above with respect to FIG. 7, and therefore further detailed description thereof is omitted.

The wordline driver supply circuit (1120) includes transistors (1121 and 1122). Similar to the embodiment illustrated in FIG. 7, the transistors (1121 and 1122) may be connected in parallel to support the read-assist mode, while avoiding configurations in which transistors may be connected in series. Thereby, an impact on speed of the wordline driver supply circuit (1120) may be minimized.

Based on the control signals (A, B) and voltages (VDD and VDD_HIGH), the wordline driver supply circuit (1120) may output the wordline supply voltage (VDD_WL) according to the three modes.

According to the embodiments, the wordline driver supply block seamlessly integrates read-assist and write-assist capability in combination with a power-gating mode while imposing negligible overhead in terms of area and speed, thereby providing an area-efficient, elegant circuitry implementation of multiple power supplies for reduced power consumption of a microprocessor.

According to the embodiments, multiple low power operational modes of the memory and a power down mode may be implemented for minimal area cost.

According to the embodiments, the addition of series transistors is avoided, and a transistor may be controlled to permit for multiple operational modes of the memory. As a result, processing speed may be improved, as compared to implementations including transistors in series.

According to the embodiments, a conventional power-gating transistor may be employed, while enabling the control of multiple operational modes, such as to either connect or disconnect power supply from the wordline driver, or disconnect the power supply during write-assist wordline boost.

According to the embodiments, read-assist may be supported by two parallel transistors, each transistor connected to a power supply, while enabling the transistors to additionally implement power-gating.

According to the embodiments, the wordline driver supply control logic may produce digital signals, which may be steady-state or clock-like for capacitive bootstrapping in write-assist mode.

A number of embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A wordline driver supply block comprising:
   a wordline driver supply control circuit configured to receive one or more control inputs that indicate an operational mode of a memory of a microprocessor and output one or more control signals that indicate a wordline supply voltage corresponding to the operational mode; and
   a wordline driver supply circuit configured to receive the one or more control signals and one or more voltages, and output the wordline supply voltage corresponding to the operational mode based on the received one or more control signals and the one or more voltages.

2. The wordline driver supply block according to claim 1, wherein the wordline driver supply circuit is configured to output the wordline supply voltage to wordlines of the memory.

3. The wordline driver supply block according to claim 2, wherein the one or more control inputs indicate a plurality of operational modes and the one or more voltages comprise a plurality of voltages.

4. The wordline driver supply block according to claim 3, wherein the plurality of operational modes comprises a power down mode and at least one of a read-assist mode and a write-assist mode.

5. The wordline driver supply block according to claim 3, wherein the plurality of voltages comprises a first voltage supplied to bitcells of the memory and a second voltage supplied to periphery logic of the memory, and
   wherein the first voltage is higher than the second voltage.

6. The wordline driver supply block according to claim 5, wherein the wordline supply voltage comprises one of the first voltage and the second voltage.

7. The wordline driver supply block according to claim 5, wherein the wordline supply voltage comprises one of the first voltage, the second voltage, and a voltage higher than the first voltage.

8. The wordline driver supply block according to claim 3, wherein the memory is a single-supply memory.

9. The wordline driver supply block according to claim 8, wherein the plurality of operational modes comprises a power down mode and a write-assist mode.

10. The wordline driver supply block according to claim 3, wherein the memory is a dual-supply memory.

11. The wordline driver supply block according to claim 10, wherein the plurality of operational modes comprises a power down mode and a read-assist mode.

12. The wordline driver supply block according to claim 1, wherein the wordline driver supply control circuit comprises logic circuitry configured to combine the one or more control inputs into the one or more control signals.

13. The wordline driver supply block according to claim 12, wherein the wordline driver supply control circuit further comprises a delay circuit configured to shift at least one of the one or more control inputs, and
   wherein the delay circuit comprises a plurality of delay blocks configured to shift the at least one of the at least one of the one or more control inputs.

14. The wordline driver supply block according to claim 13, wherein the at least one of the at least one of the one or more control inputs is a clock signal.

15. The wordline driver supply block according to claim 1, wherein the wordline driver supply circuit comprises a first transistor connected in parallel to a second transistor.

16. The wordline driver supply block according to claim 15, wherein the wordline driver supply circuit further comprises a bootstrap capacitor configured to capacitively boost the wordline supply voltage.

17. The wordline driver supply block according to claim 1, wherein the one or more control signals comprise steady-state signals or clock-like signals.

18. A method of controlling a memory of a microprocessor, the method comprising:
   receiving one or more control inputs that indicate an operational mode of the memory;
   generating one or more control signals based on the one or more control inputs;
   combining the one or more control inputs into a multiplexer selection signal that indicates a wordline supply voltage corresponding to the operational mode;
   receiving one or more voltages; and
   outputting the wordline supply voltage corresponding to the operational mode based on the multiplexer selection signal and the one or more voltages.

19. The method according to claim 18, wherein the receiving one or more control inputs comprises receiving the one or more control inputs at a wordline driver supply block, and wherein the outputting comprises the wordline driver supply block outputting the wordline supply voltage to the memory of the microprocessor.

20. The method according to claim 19, wherein the outputting comprises outputting the wordline supply voltage to wordlines of the memory.

* * * * *